US 6,539,314 B1

(12) United States Patent
Ondrus et al.

(10) Patent No.: US 6,539,314 B1
(45) Date of Patent: Mar. 25, 2003

(54) METHOD FOR SIMULATING A JOINT

(75) Inventors: Daniel Joseph Ondrus, Northville, MI (US); Harihar T. Kulkarni, Canton, MI (US); John M Baldwin, Warren, MI (US)

(73) Assignee: Ford Motor Company, Dearborn, MI (US)

( * ) Notice: Subject to any disclaimer, the term of this patent is extended or adjusted under 35 U.S.C. 154(b) by 0 days.

(21) Appl. No.: 09/561,301

(22) Filed: Apr. 28, 2000

(51) Int. Cl.⁷ .............................................. G06F 19/00
(52) U.S. Cl. ....................... 702/41; 525/119; 280/288
(58) Field of Search ........................... 702/41; 525/119; 280/288

(56) References Cited

U.S. PATENT DOCUMENTS 5,364,115 A * 11/1994 Klein et al. ................ 280/279
6,051,652 A * 4/2000 Kawate et al. ............. 522/102

* cited by examiner

Primary Examiner—John S. Hilten
Assistant Examiner—Stephen J. Cherry

(57) ABSTRACT

A method for simulating a particular adhesive joint having an elasticity modulus which changes over a particular period of time and/or over a range of temperature is disclosed wherein the method provides a more accurate simulation of the particular adhesive joint. The method includes collecting stress and strain values for the adhesive joint over the particular period of time and/or over the range of temperatures such that an elastic modulus may be determined for the adhesive joint as a function of time and/or temperature. Once the elastic modulus is determined, a simulated joint is formed based upon the adhesive joint, and the simulated joint is capable of producing strain values by using the elastic modulus when data related to stress is entered into the simulated joint.

18 Claims, 2 Drawing Sheets

METHOD FOR SIMULATING A JOINT

FIELD OF INVENTION

The present invention relates to a method for simulating a joint which undergoes shear, tensile and/or compression strain due to stresses placed upon that joint. More specifically, the present invention relates to a method for simulating an adhesive joint which has an elasticity modulus which substantially changes over a period of time and/or over a range of temperatures.

BACKGROUND OF THE INVENTION

Adhesive joints (e.g., joints formed from glues, adhesives or polymers) are used in a variety of applications to attach, connect and/or integrate components of articles of manufacture. Often it is desirable to model and/or simulate adhesive joints. Particularly, it is desirable to simulate an adhesive joint in order to gain a better knowledge of the strain a particular adhesive joint will experience when that particular joint is subjected to stress caused by forces placed upon the joint. This knowledge, amongst other things, aids and/or assists individuals in choosing whether a particular adhesive joint should be used for a particular article of manufacture where the article of manufacture subjects or exposes the joint to particular forces and/or stresses.

Conventional methods of simulating joints and simulating the strain experienced by such joints utilize conventional engineering equations which include elasticity moduli which relate the strain of a particular joint to the stress experienced by the joint. These conventional methods of simulating joints suffer from drawbacks. Conventional methods typically assume that an elasticity modulus for a particular joint is constant or substantially constant such that stress and strain have a substantially linear relationship.

In many instances, and particularly for adhesive joints which are drying or solidifying, the elasticity modulus of a particular adhesive joint changes substantially over time and at different temperatures. For example an adhesive joint which has recently been formed will become more resistant to strain as the joint solidifies, thereby changing the elasticity modulus of the joint over a period of time during which the adhesive is solidifying. Consequently, a conventional simulation of a joint which includes a constant elasticity modulus will inherently be inaccurate.

Therefore, it is desirable to provide a method of simulating an adhesive joint which includes an elastic modulus which changes as a function of time and/or temperature.

SUMMARY OF THE INVENTION

It is a first object of the present invention to provide a method for simulating an adhesive joint which overcomes the previously delineated drawbacks of conventional methods for simulating a joint.

It is a second object of the present invention to provide a method for simulating an adhesive joint which includes a modulus of elasticity which changes as a function of time and/or temperature.

According to a first aspect of the present invention a method for modeling an adhesive joint is disclosed, the joint having an elastic modulus which changes over a period of time. The method includes the steps of: collecting stress and strain values for the joint over the period of time; determining an elastic modulus for the joint as a function of time based upon the stress and strain values; and forming a simulated joint based upon the joint, the simulated joint capable of receiving simulated stress values and capable of producing strain values by using the elastic modulus.

According to a second aspect of the invention a method for modeling an adhesive joint, the adhesive joint having an elastic modulus which changes over a particular range of temperatures, said method comprising: collecting stress and strain values for the adhesive joint over the range of temperatures; determining an elastic modulus for the adhesive joint as a function of temperature based upon the stress and strain values; and forming a simulated joint based upon the adhesive joint, the simulated joint capable of receiving simulated stress values and capable of producing strain values by using the elastic modulus.

According to a third aspect of the invention a method for modeling an adhesive joint, the adhesive joint having an elastic modulus which changes over a particular period of time and over a range of temperatures, said method comprising: collecting stress and strain values for the adhesive joint over the period of time and said range of temperatures; determining an elastic modulus for the adhesive joint as a function of time and temperature based upon the stress and strain values; and forming a simulated joint based upon the adhesive joint, the simulated joint capable of receiving simulated stress values and capable of producing strain values by using the elastic modulus.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1:
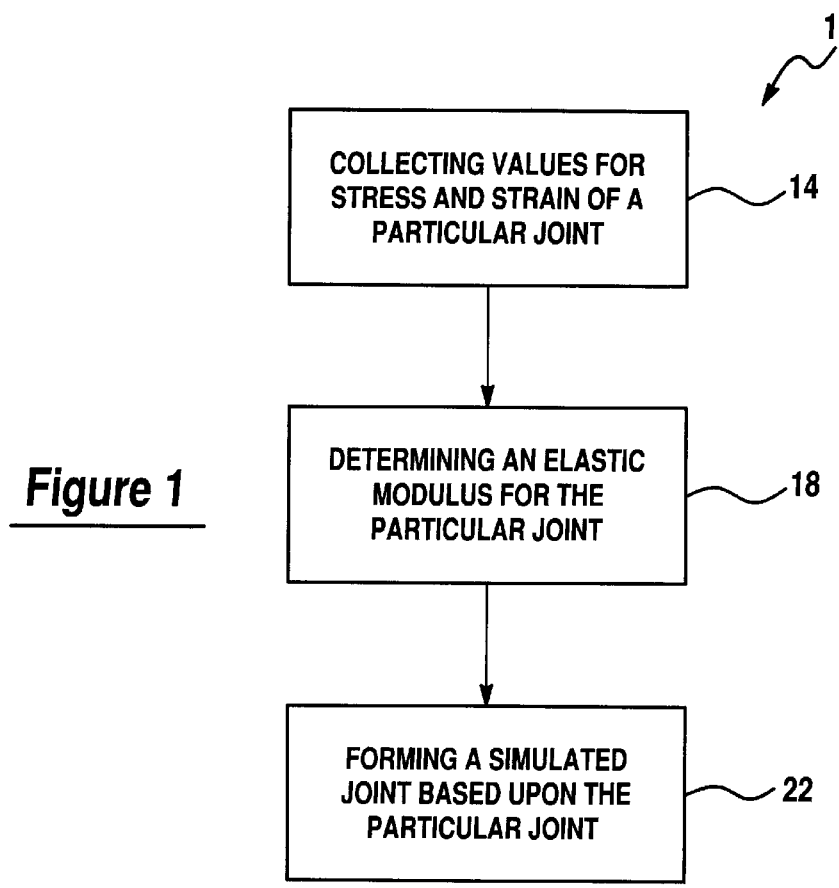
FIG. 1 illustrates a flowchart of a method for simulating a joint according to a preferred embodiment of the present invention.

Referring now to FIG. 1, there is shown a flowchart or block diagram of a method 10 for simulating a joint according to a preferred embodiment of the invention.

The first step 14 of method 10 includes collecting values of strain for a particular adhesive joint for a particular period of time and/or a particular range of temperatures, wherein the resistance of the joint to strain and/or stress changes such that the elastic modulus of the joint changes over the particular period of time and/or due to temperature changes. In a non-limiting embodiment of the invention, the stress and strain values are collected in a conventional manner by studying, observing and/or collecting values for forces or stress which the particular joint is subjected or exposed to over the particular period of time or over a range of temperatures and the strain caused by the forces or stress. For example, in one non-limiting embodiment, values for tensile strain are calculated by determining or measuring the length, cross-sectional area and/or force placed upon a particular adhesive joint over a particular period of time (e.g., a period of time during which an adhesive joint cures), and calculating stress and strain using conventional equations such as:

$$\text{Strain }(\varepsilon) = \frac{\Delta L}{L_o} \text{ and Stress }(\sigma) = \frac{F}{A_o}$$

where $A_O$ is the cross-sectional area of the joint, F is the force applied to the joint, $L_O$ is the initial length of the joint and $\Delta L$ is the change in length of the joint. In the preferred embodiment of the invention, values for variables such as F, $A_O$, $L_O$ and others which may be needed are collected in a conventional manner at predetermined intervals of time (e.g., every ten minutes) throughout the period of time for which the joint is being simulated and/or at predetermined intervals of temperature (e.g., every three degrees Celsius) for the range of temperatures which is to be simulated. The variables collected can account for all types of strain that the joint will experience including tensile, compression and/or shear strain to adequately simulate the adhesive joint. If exact values cannot be collected directly from the particular joint, the values may be estimated using engineering judgment. Once such data has been acquired, estimated and/or collected, the values for the variables such as F, $A_O$, $L_O$ and others are entered into a conventional computer or computer system which is capable of forming, creating and/or calculating the variables as functions of time and/or temperature such as F(t), $A_O$(t), $L_O$(t) where t is time, temperature and/or a function itself of time and temperature. Also in the preferred embodiment, the computer is programmed to use equations based on the variables collected to create, calculate and/or form values for the stress and strain as functions of time and/or temperature according to conventional stress and strain equations such as and only for example:

$$\varepsilon(t) = \frac{\Delta L}{L_o}(t) \text{ and } \sigma(t) = \frac{F}{A_o}(t).$$

The second step 18 of the method 10 includes determining an elasticity modulus or elasticity moduli for the adhesive joint. In the preferred embodiment, the elasticity modulus or moduli are determined and/or calculated as functions of time and/or temperature during the particular period of time and/or range of temperatures of the first step 14 and based upon the stress and strain values collected in the first step 14.

In a non-limiting embodiment of the invention, the elasticity modulus or moduli are determined according to conventional equations. For example, the elastic modulus or moduli may be calculated according to Hooke's law which is represented by the following equation:

$$\text{Stress}(\sigma) = E(\text{Strain}(\varepsilon))$$

where E is the elasticity modulus. Consequently, E may be calculated by dividing stress values by strain values as follows:

$$E = (\text{Stress}(\sigma))/(\text{Strain}(\varepsilon))$$

In the preferred embodiment the stress and strain functions of time and/or temperature which are calculated in the first step 14 of the method 10 are utilized to create, form and/or calculate the elasticity modulus as a function of time and/or temperature for the particular joint. As an example, the computer and/or computer program calculates or plots a graph of the elastic modulus of the joint as a function of time by dividing stress by strain according to Hooke's law. An exemplary equation is as follows:

$$E(t) = (\sigma(t)/(\varepsilon(t))$$

Figure 2:
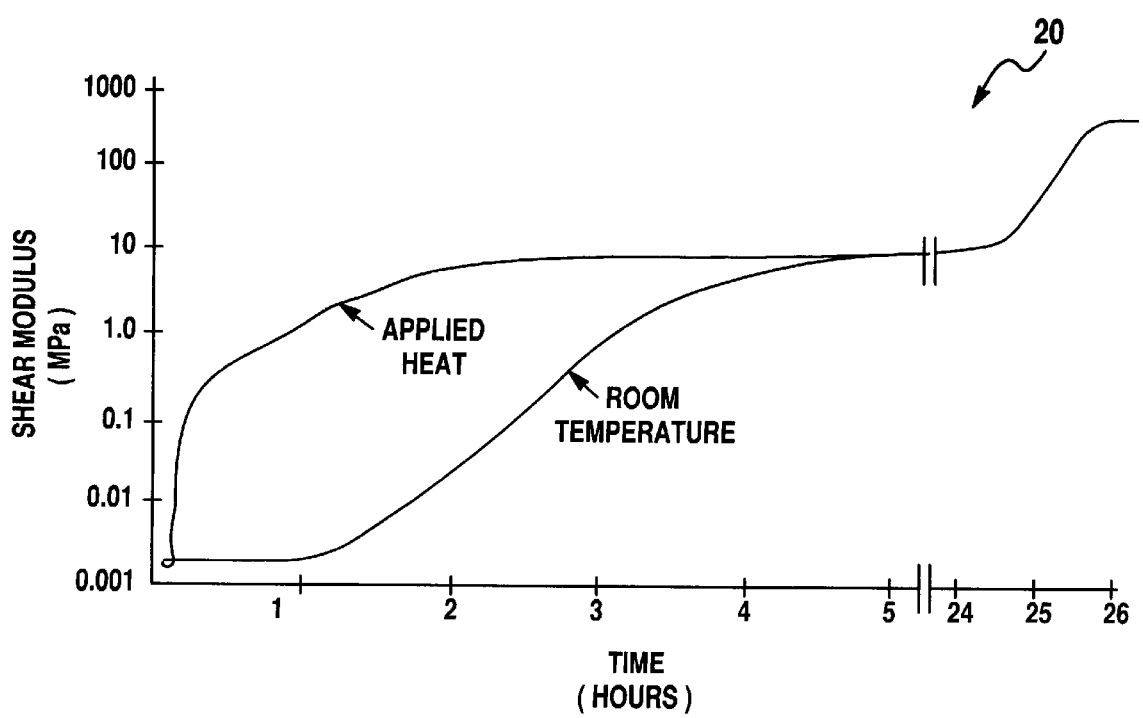
FIG. 2 illustrates a graph of a modulus of elasticity over a period of time and for different temperature conditions according to a preferred embodiment of the present invention.
Figure 3:
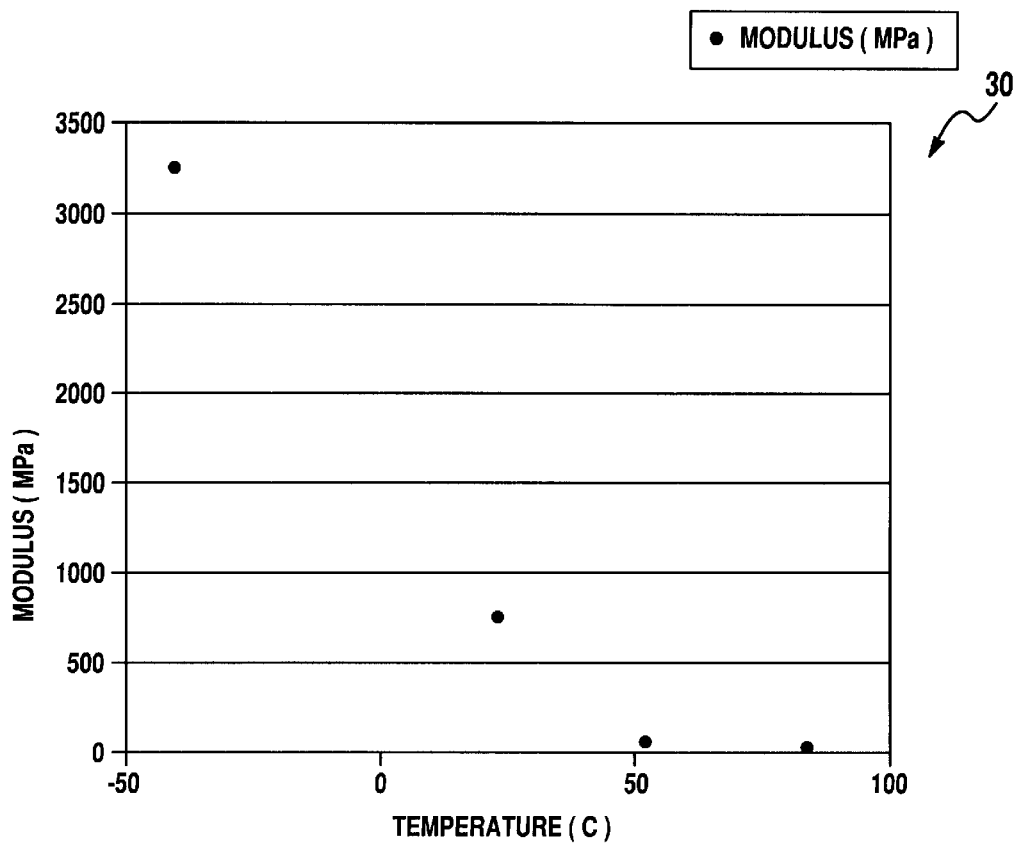
FIG. 3 illustrates a graph of the modulus of elasticity of a joint over a range of temperatures according to a preferred embodiment of the present invention.

Furthermore, in the preferred embodiment, the computer or other analytical equipment forms or creates a visual representation of the elasticity or Young's modulus as a function of time and/or temperature for the particular period of time and/or range of temperatures for which the particular adhesive joint is being simulated. In one non-limiting embodiment, the analytical equipment forms or creates a visual representation in the form of a line graph having an axis with time values and an axis with values of the elasticity modulus and a line or curve which is drawn, represented or fit according to values derived from the stress and strain functions of time under varying temperature conditions. A representative graph 20 is shown in FIG. 2 which illustrates the elasticity of a joint over a period of time during which heat is applied to the joint such that the joint stiffens or cures at an accelerated rate. Graph 20 further illustrates the elasticity of a joint over a period of time during which the joint is allowed to stiffen or cure at room temperature (e.g., around 72° Fahrenheit). In another non-limiting embodiment, the computer forms or creates a visual representation, such as a graph that plots the modulus of elasticity at different temperatures. One example of such a graph 30 is shown in FIG. 3.

Figure 4:
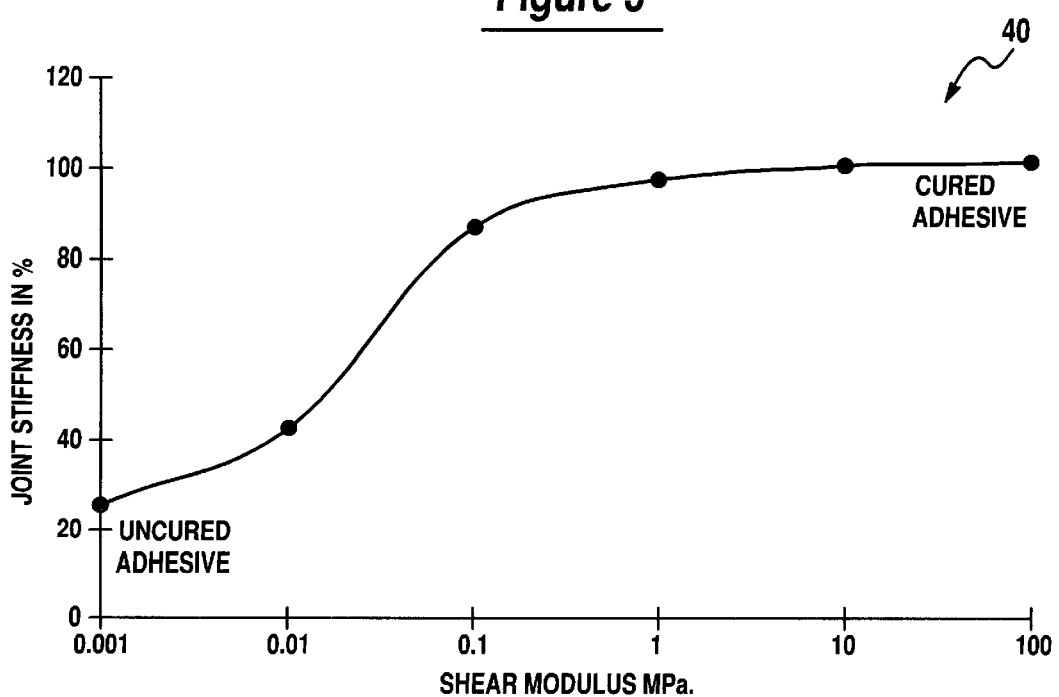
FIG. 4 illustrates a graph of the torsional stiffness of a joint for a changing modulus of elasticity according to a preferred embodiment of the present invention.

In alternate embodiments, other graphs may be produced as well. For example and without limitation, in a further non-limiting embodiment, a line graph (i.e., graph 40 of FIG. 4) is formed which relates elasticity modulus to the stiffness of the joint. In graph 40, stiffness is shown as a function of the elasticity modulus which is a function of time and/or temperature.

The third step 22 of the method 10 includes forming a simulated joint based upon the particular adhesive joint, and which is capable of receiving simulated stress values and capable of producing simulated strain values by using the elastic modulus or moduli.

In a non-limiting embodiment, the simulated joint is formed using a conventional computer aided design ("CAD") program which provides a visual representation of the joint. The simulated joint and/or program is capable of receiving values for time, force, temperature, area, stress and/or other variables and is further capable of producing a visual representation of the particular adhesive joint as the particular adhesive joint would appear if the particular joint were strained according to the actual forces and/or stresses for the amounts of time and/or at the temperatures for which values are inputted into the simulated joint.

In the preferred embodiment, the simulated joint provides a visual representation of the particular joint for the entire period of time and/or range of temperatures for which data or values for temperature, time, stress and for strain have been provided. Furthermore, the simulated joint includes the elasticity modulus of the adhesive joint as a function of time or temperature. Therefore, a user of the simulated joint may enter or input various values for stress or force to be applied to the simulated joint and the simulated joint can produce a visual representation of the particular adhesive joint as it would react to such forces and/or stresses over time and/or over a range of temperatures.

It shall be recognized that simulation of a particular adhesive joint, which includes the modulus of elasticity of the particular joint as the modulus changes over a period of time and/or over a range of temperatures produces a more accurate simulation of the adhesive joint, as the adhesive joint is effected by forces over a period of time and/or over a range of temperatures. The method of the present invention forms a simulation which is especially suited to accurately simulate adhesive joints such as glue, polymer and/or other adhesive joints which have moduli of elasticity which substantially change as the adhesive, which forms the adhesive joint, changes from a liquid, "uncured" or gel state to a cured or solid state.

It should be understood that the invention is not limited to the exact embodiment or construction which has been illustrated and described but that various changes may be made without departing from the spirit and the scope of the invention.

What is claimed is:

1. A method for modeling an adhesive joint, said adhesive joint having an elastic modulus which changes over a particular period of time, said method comprising:

collecting stress and strain values for said adhesive joint over said period of time;

determining an elastic modulus for said adhesive joint as a function of time based upon said stress and strain values; and forming a simulated joint based upon said adhesive joint, said simulated joint receiving simulated stress values and producing strain values by using said time based elastic modulus for a plurality of points spanning said period of time.

2. The method of claim 1 wherein said step of collecting stress and strain values is performed at predetermined intervals of time during said period of time.

3. The method of claim 1, further comprising:

forming a graph of said elastic modulus as a function of time.

4. The method of claim 1, wherein said step of forming the simulated joint is performed using a computer aided drafting program.

5. The method of claim 1 wherein the simulated joint is capable of providing a visual representation of the adhesive joint for the entirety of said period of time.

6. The method of claim 1 wherein said adhesive joint is at an uncured state during one portion of said period of time and is at a cured state during another portion of said period of time.

7. A method for modeling an adhesive joint, said adhesive joint having an elastic modulus which changes over a particular range of temperatures, said method comprising:

collecting stress and strain values for said adhesive joint over said range of temperatures;

determining an elastic modulus for said adhesive joint as a function of temperature based upon said stress and strain values; and forming a simulated joint based upon said adhesive joint, said simulated joint receiving simulated stress values and producing strain values by using said temperature based elastic modulus for the a plurality of temperatures wherein each temperature of said plurality of temperatures resides within said range of temperatures.

8. The method of claim 7 wherein said step of collecting stress and strain values is performed at predetermined intervals of temperature within said range of temperatures.

9. A claim as in claim 7, further comprising the step of:

forming a graph of said elastic modulus as a function of temperature.

10. The method of claim 7, wherein said step of forming the simulated joint is performed using a computer aided drafting program.

11. The method of claim 7 wherein the simulated joint is capable of providing a visual representation of said adhesive joint for the entirety of said range of temperature.

12. The method of claim 7 wherein said adhesive joint is at an uncured state during one portion of said range of temperatures and is at cured state during another portion of said range of temperatures.

13. A method for modeling an adhesive joint, said adhesive joint having an elastic modulus which changes over a particular period of time and over a range of temperatures, said method comprising:

collecting stress and strain values for said adhesive joint over said period of time and said range of temperatures;

determining an elastic modulus for said adhesive joint as a function of time and temperature based upon said stress and strain values; and to forming a simulated joint based upon said adhesive joint, said simulated joint receiving simulated stress values and producing strain values by using said time and temperature based elastic modulus for a plurality of points spanning said period of time and for a plurality of temperatures wherein each temperature of said plurality of temperatures resides within said range of temperatures.

14. The method of claim 13 wherein said step of collecting stress and strain values is performed at predetermined intervals of time during said period of time and at predetermined intervals of temperature over said range of temperatures.

15. The method of claim 13, further comprising the step of:

forming a graph of said elastic modulus as a function of time and temperature.

16. The method of claim 13, wherein said step of forming the simulated joint is performed using a computer aided drafting program.

17. The method of claim 13 wherein the simulated joint is capable of providing a visual representation of the particular joint for the entirety of said period of time and for the entirety of said range of temperatures.

18. The method of claim 13 wherein said adhesive joint is in a uncured state during one portion of said period of time and is in cured state during another portion of said period of time.

* * * * *